(12) United States Patent
Gaitonde et al.

(10) Patent No.: US 8,219,957 B1
(45) Date of Patent: Jul. 10, 2012

(54) GLOBAL PLACEMENT LEGALIZATION FOR COMPLEX PACKING RULES

(75) Inventors: Dinesh D. Gaitonde, Fremont, CA (US); Steven Li, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 180 days.

(21) Appl. No.: 12/698,902

(22) Filed: Feb. 2, 2010

(51) Int. Cl.
*G06F 17/50* (2006.01)

(52) U.S. Cl. ........................................ 716/119

(58) Field of Classification Search .................. 716/100, 716/119
See application file for complete search history.

(56) References Cited

U.S. PATENT DOCUMENTS

| | | | |
|---|---|---|---|
| 6,480,991 B1* | 11/2002 | Cho et al. | 716/122 |
| 2003/0005398 A1* | 1/2003 | Cho et al. | 716/8 |
| 2005/0166169 A1* | 7/2005 | Kurzum et al. | 716/10 |
| 2008/0216038 A1* | 9/2008 | Bose | 716/8 |
| 2008/0216039 A1* | 9/2008 | Furnish et al. | 716/9 |
| 2009/0031269 A1* | 1/2009 | Chen et al. | 716/9 |
| 2010/0023910 A1* | 1/2010 | Chen et al. | 716/10 |
| 2010/0037196 A1* | 2/2010 | Chong et al. | 716/9 |
| 2010/0281448 A1* | 11/2010 | He | 716/6 |
| 2012/0054699 A1* | 3/2012 | Cho et al. | 716/102 |

* cited by examiner

*Primary Examiner* — Suchin Parihar
(74) *Attorney, Agent, or Firm* — Kevin T. Cuenot

(57) ABSTRACT

A method performed by a system comprising a processor and a memory can include performing a global placement of a circuit design for a target programmable integrated circuit (IC) and clustering the circuit design using a selected size of cluster regions according to control sets identified within the circuit design. The method further can include determining a legalized placement of the clustered circuit design by solving a minimum cost network flow problem for the selected size of the cluster regions and the target programmable IC and assigning components to sites of the target programmable IC according to the legalized placement. The circuit design specifying the legalized placement can be stored within the memory.

17 Claims, 3 Drawing Sheets

Cluster A = {1, 1, 1, 1}
Cluster B = {1, 1}
Cluster C = {2, 2, 2, 2}
Cluster D = {3, 3, 3, 3}
Cluster E = {4, 4, 4, 4}
Cluster F = {5, 5}
Cluster G = {6, 6, 6, 6}
Cluster H = {7, 7, 7}
Cluster I = {8, 8, 8, 8}
Cluster J = {9}

GLOBAL PLACEMENT LEGALIZATION FOR COMPLEX PACKING RULES

FIELD OF THE INVENTION

The embodiments disclosed within this specification relate to integrated circuit devices (ICs). More particularly, the embodiments relate to placing a circuit design on a programmable IC.

BACKGROUND

Programmable integrated circuit devices (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic circuitry. The programmable interconnect circuits typically includes a large number of interconnect lines of varying lengths interconnected by programmable interconnect points (PIPs). The programmable logic circuits implement the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

When a circuit design is implemented on a programmable IC, the components of the circuit design must be assigned to suitable programmable resources or elements on the programmable IC. This process is referred to as "placement." The placement process requires an accurate estimate of the capacity of the programmable IC upon which the circuit design is to be implemented to determine whether that circuit design is feasible with respect to the selected programmable IC. Capacity of a programmable IC, however, is dependent upon the complexities of the circuit design being placed therein and how efficiently that circuit design is prepared for implementation within the programmable IC.

In illustration, the circuit architecture of a programmable IC can limit the particular components that can be placed in proximity to one another. These architectural realities can be expressed as "packing rules" that dictate which components can be located, e.g., "packed," within a same portion of the programmable IC as other components. For example, consider a portion of a programmable IC called a "slice." In general, four flip flops can be assigned to each slice. If each of the four flip flops assigned to a particular slice, however, has a different clocking requirement, the packing rules often dictate that those four flip flops cannot be located within the same slice. Thus, due to architectural limitations of the programmable IC and the clocking needs of the circuit design, four slices may be required instead of one, e.g., one slice for each flip flop. When the entire circuit design is considered, one can see that the number of slices needed to pack and place a circuit design can depend significantly upon the complexity of the circuit design and the processing applied during implementation. Thus, whether a given programmable IC includes sufficient capacity for a given circuit design is not entirely clear from the capacity of the programmable IC alone.

Typically, placement is a multi-phase process in which components are, at least initially, assigned to locations on the programmable IC that are not "legal." The initial placement is refined through subsequent placement phases that attempt to remove the illegal component placements. These phases of placement sometimes are referred to as "detailed placement" or "legalization." Legalization can result in significant perturbation of the initial global placement of the circuit design. This perturbation may or may not be desirable, particularly since the initial global placement have had specific characteristics in terms of timing and the like. Further, the quality of the legalized placement is often dependent upon the order in which legalization is performed. More particularly, the quality of the legalized placement is often dependent upon the order in which components are selected and relocated to legal locations during the legalization process.

SUMMARY

The embodiments disclosed within this specification relate to integrated circuit devices (ICs) and, more particularly, to placing a circuit design on a target programmable IC. One embodiment of the present invention can include a method implemented using a system comprising a processor and a memory. The method can include performing a global placement of a circuit design for a target programmable IC and clustering the circuit design using a selected size of cluster regions according to control sets identified within the circuit design. A legalized placement of the clustered circuit design can be determined, by the processor, by solving a minimum cost network flow problem for the selected size of the cluster regions and the target programmable IC. Components of the circuit design can be assigned to sites of the target programmable IC according to the legalized placement. The circuit design specifying the legalized placement can be stored within the memory.

The method can include iteratively clustering and determining a legalized placement over a plurality of different sizes of cluster regions to generate a plurality of legalized placements. A cost can be determined for each legalized placement. Each legalized placement can be stored in the memory in association with the cost of the legalized placement and the size of the cluster regions used in determining the legalized placement.

The method also can include selecting one of the plurality of legalized placements according to the cost of each of the plurality of legalized placements. For example, the legalized placement having the lowest cost can be selected. The method further can include increasing size of the cluster regions used to perform clustering after each iteration of clustering and determining a legalized placement.

In one aspect, clustering can include assigning only components belonging to a same control set to a same cluster. In another aspect, clustering can include limiting a number of components to be included within each cluster to a capacity of a hardware resource capable of receiving a cluster.

Another embodiment of the present invention can include a system comprising a memory storing program code and a processor coupled to the memory and executing the program code. The processor can be configured to perform steps including performing a global placement of a circuit design for a target programmable IC and clustering the circuit design using a selected size of cluster regions according to control sets identified within the circuit design. The processor further can be configured to perform steps including determining a legalized placement of the clustered circuit design by solving a minimum cost network flow problem for the selected size of cluster regions and the target programmable IC and assigning components to sites of the target programmable IC according to the legalized placement. The processor can store the circuit design specifying the legalized placement within the memory.

The processor can be configured to perform steps including iteratively clustering and determining a legalized placement over a plurality of different sizes of cluster regions generating a plurality of legalized placements, determining a cost for each legalized placement, and storing each legalized placement in the memory in association with the cost of the legalized placement and the size of the cluster regions used in determining the legalized placement.

The processor further can be configured to perform the step of selecting one of the plurality of legalized placements according to cost of each of the plurality of legalized placements. In one embodiment, the legalized placement having the lowest cost can be selected. The processor also can be configured to increase the size of the cluster regions used to perform clustering after each iteration of clustering and determining a legalized placement.

In one aspect, clustering can include assigning only components belonging to a same control set to a same cluster. In another aspect, clustering can include limiting a number of components to be included within each cluster to a capacity of a hardware resource capable of receiving a cluster.

Another embodiment of the present invention can include a device comprising a data storage medium usable by a system comprising a processor and a memory. The data storage medium can store program code that, when executed by the system, configures the system to execute operations. The operations can include performing a global placement of a circuit design for a target programmable IC and clustering the circuit design using a selected size of cluster regions according to control sets identified within the circuit design. The operations also can include determining a legalized placement of the clustered circuit design by solving a minimum cost network flow problem for the selected size of cluster regions and the target programmable IC and assigning components to sites of the target programmable IC according to the legalized placement. The circuit design specifying the legalized placement can be stored within the memory.

The device further can configure the system to execute operations including iteratively clustering and determining a legalized placement over a plurality of different sizes of cluster regions generating a plurality of legalized placements, determining a cost for each legalized placement, and storing each legalized placement in the memory in association with the cost of the legalized placement and the size of the cluster regions used in determining the legalized placement.

The device also can configure the system to execute the operation of selecting one of the plurality of legalized placements according to cost of each of the plurality of legalized placements. For example, in one embodiment, the legalized placement having the lowest cost can be selected. The device further can configure the system to execute an operation including increasing the size of the cluster regions used to perform clustering after each iteration of clustering and determining a legalized placement.

In one aspect, clustering can include assigning only components belonging to a same control set to a same cluster. In another aspect, clustering can include limiting a number of components to be included within each cluster to a capacity of a hardware resource capable of receiving a cluster.

DETAILED DESCRIPTION

While the specification concludes with claims defining the features of the embodiments of the invention that are regarded as novel, it is believed that the embodiments of the invention will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to integrated circuit devices (ICs) and, more particularly, to placing a circuit design on a programmable IC. In accordance with the inventive arrangements disclosed within this specification, a circuit design to be implemented within an IC can be placed by first applying a global placement technique. Subsequently, the result of global placement can be legalized by, in part, applying a clustering technique. The circuit design can be clustered in a manner that accounts for packing rules that are applicable to the circuit design in view of the particular programmable IC within which the circuit design is to be instantiated (referred to as the "target programmable IC").

A legalized placement of the circuit design can be determined by operating upon the clustered circuit design. Legalization of the clustered circuit design can be formulated as a minimum cost network flow problem and solved. In one aspect, the embodiments described can be iteratively applied. For example, clustering can be performed iteratively. Each time clustering is performed, a different size of cluster region can be used. For each of the resulting clustered circuit designs, a legalized placement can be determined by solving the minimum cost network flow problem. Each of the legalized placements can be associated with a cost. One of the legalized placements then can be selected according to the costs and applied to the circuit design for implementation within the target programmable IC.

Figure 1:
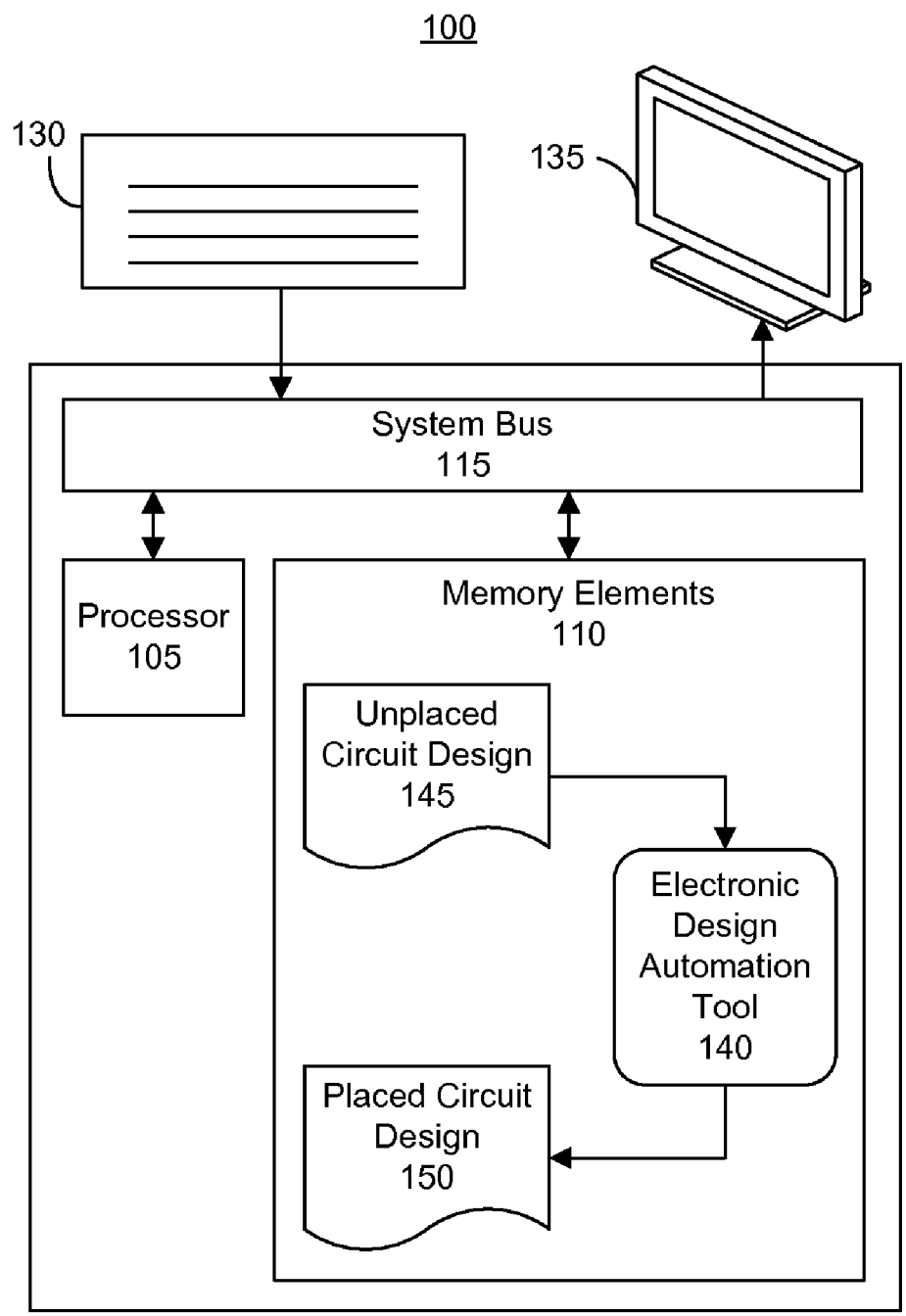
FIG. 1 is a block diagram illustrating a system for placing a circuit design in accordance with one embodiment of the present invention.

FIG. 1 is a block diagram illustrating a system 100 for placing a circuit design in accordance with one embodiment of the present invention. In one aspect, system 100 can generate one or more circuit designs for instantiation within a target programmable IC. System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory and one or more bulk storage devices (not shown). Local memory refers to random access memory or other non-persistent memory device(s) generally used during actual execution of the program code. Bulk storage device(s) can be implemented as a hard drive or other persistent data storage device. System 100 also can include one or more cache memories (not shown) that provide temporary storage of at least some program code in order to reduce the number of times program code must be retrieved from bulk storage device during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store an electronic design automation (EDA) tool 140. EDA tool 140, being implemented in the form of executable program code, can be executed by system 100. EDA tool 140 can receive an unplaced circuit design 145 as input, perform a placement process upon unplaced circuit design 145, and output placed circuit design 150. Placed circuit design 150 has a legalized placement as described within this specification. As used herein, "outputting" and/or "output" can mean, for example, writing to a file, writing to a user display or other output device, storing in memory, sending or transmitting to another system, exporting, or the like.

For purposes of illustration, other tasks relating to hardware synthesis such as mapping, routing, and the like are not described within this specification. It should be appreciated, however, that EDA tool 140 can be configured to perform one or more of such tasks without limitation. For example, EDA tool 140 can be configured to perform each of the tasks necessary to generate configuration data from placed circuit design 150 and then load the configuration data into the target programmable IC to instantiate placed circuit design 150 within hardware.

Figure 2:
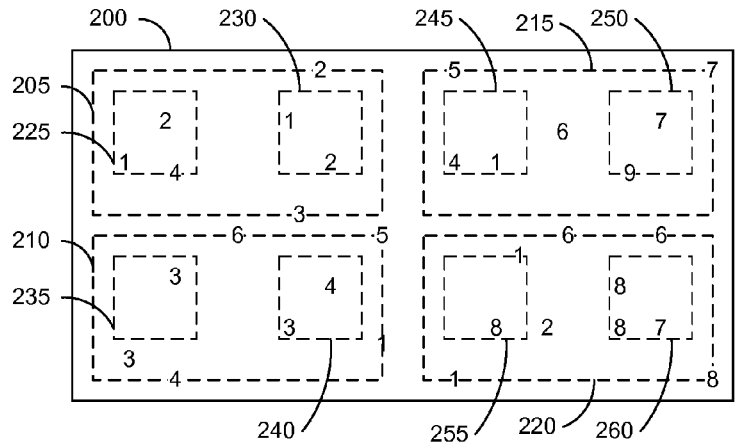
FIG. 2 is a block diagram illustrating clustering of components of a circuit design in accordance with another embodiment of the present invention.

FIG. 2 is a block diagram illustrating clustering of components of a circuit design in accordance with another embodiment of the present invention. The clustering illustrated in FIG. 2 can be performed using a system as described with reference to FIG. 1.

In general, a programmable IC can include a plurality of hardware resources such as configurable logic blocks (CLBs) that are spread out over the device in grid-like fashion. Each CLB can include two hardware resources called slices. Each slice can include, or accommodate, four flip flops. Slices can include other components such as lookup tables which, for purposes of clarity and illustration, are not discussed within this specification. It should be appreciated that slices and CLBs are used within this specification for purposes of illustration. The embodiments disclosed, however, can be applied to other varieties of programmable ICs that utilize other circuit structures or hierarchies arranged in a grid-like pattern over the programmable IC. In this sense, CLBs, slices, and other hardware resources are used as non-limiting examples to illustrate the embodiments disclosed within this specification.

The term "site," as used within this specification, can refer to a particular hardware resource such as a CLB or a slice that resides at a particular location upon the programmable IC. The hardware resource can be programmed to implement one or more components, e.g., the components assigned to that site. As an example, a slice refers to circuitry at a specific coordinate location of the programmable IC that can be assigned up to four flip flops. Accordingly, each slice is an example of a site that can be configured or programmed to implement, or receive, up to four flip flops.

To facilitate placement of components to sites on the target programmable IC, a coordinate system can be used. The coordinate system can be overlaid upon the target programmable IC. In one embodiment, the coordinate system can be a two-dimensional, floating point coordinate system that is used to assign each component of the circuit design to a location on the target programmable IC. Each coordinate assigned to a component, at least initially, may not correspond to a site available for placement of that component.

Returning to the figures, FIG. 2 illustrates a cluster region 200 of a target programmable IC. In this example, cluster region 200 includes four CLBs 205, 210, 215, and 220. As used within this specification, a "cluster region" refers to a portion of the target programmable IC having a predetermined length and width. In one embodiment, each cluster region can be rectangular in shape. In another embodiment, each cluster region can be square in shape.

In any case, as part of the clustering process, the entire programmable IC can be subdivided into a grid comprised of cluster regions such as cluster region 200. The size of cluster region 200 can be specified in terms of the coordinate system. The size of cluster region 200 also can be specified in terms of the number of rows and columns of a selected type of hardware resource, e.g., CLBs or slices, over which cluster region 200 extends. The size of a cluster region can be specified using any of a variety of different conventions. For example, when cluster regions are configured as squares, the size of each cluster region can be specified in terms of a radius that specifies one-half of the length of a line extending diagonally across the cluster region from one corner to an opposing corner of the cluster region.

As pictured in FIG. 2, CLB 205 includes slices 225 and 230. CLB 210 includes slices 235 and 240. CLB 215 includes slices 245 and 250. CLB 220 includes slices 255 and 260. CLBs 205-220 and slices 225-260 are shown with dotted lines so as not to obscure the initial placement of flip flops, denoted using numbers 1-9, from the global placement process.

The global placement process assigns a coordinate on the target programmable IC to each component of the circuit design. Each site on the target programmable IC has a particular coordinate in the coordinate system as well. Components of the circuit design are initially assigned to locations on the programmable IC using the floating point coordinate system. The assigned location of components, however, may not coincide with the coordinates of available sites on the target programmable IC. The component, for example, may be initially assigned a location that is between two available sites.

FIG. 2 illustrates an example of the placement of flip flops after global placement is performed for cluster region 200. Flip flops, represented using numbers 1-9, are assigned coordinates that do not always correspond to actual sites capable of receiving that component on the target programmable IC. Each flip flop is designated with a number representing the control set to which that flip flop belongs. Thus, a number one indicates a flip flop that belongs to control set one. A number two indicates a flip flop that belongs to control set two, etc.

The phrase "control set," as used within this specification, refers to a group of one or more components. Each member component of the control set is controlled by a same set of control signals within the circuit design. As applied to flip flops, for example, a control set can refer to a group of flip flops where each flip flop of the group is controlled by a same clock signal, set signal, reset signal, and clock enable signal. Those flip flops that are controlled by the same set of control signals can be said to belong, or be members of, the same control set. Control sets are relevant to placement and packing rules since only components of the same control set can be placed within a same slice. This is an architectural constraint of many programmable ICs since the number of control signals that can be provided to any given slice or CLB is limited. Global placement, however, is not control set aware.

The clustering process, in general, forms groups of like components called clusters. The components within each cluster are of a same type and belong to the same control set. The number of components in a particular cluster is limited to the number of components of that type that can be accommodated by a selected type of hardware resource to which the cluster is to be allocated. In this example, clusters are limited to including four flip flop type components since clusters are allocated or assigned to slices. Due to the control set limitation, two flip flops belonging to control set one and two flip flops belonging to control set two would require two slices for placement despite the total number of flip flops not exceeding four.

Referring again to FIG. 2, the system has clustered the components located within cluster region 200. The system groups components of the same control set into the same clusters. From cluster region 200, the system has generated clusters A, B, C, D, E, F, G, H, I, and J. Each cluster includes only flip flops belonging to the same control set and includes a maximum number of components that corresponds to the particular circuit structures within which the components are to be placed, in this case slices. Due to the limitation of having no more than four flip flops in a given cluster, it can be seen that no cluster includes more than four flip flops.

Cluster region 200 includes six flip flops belonging to control set one. The system has generated cluster A including four flip flips belonging to control set one. Since not all flip flops of control set one can be included in a single cluster, the system has generated cluster B to include the additional two flip flops belonging to control set one. In this regard, clusters with fewer than the maximum number of components are permissible.

The system also has generated clusters C, D, E, G and I, with each including four flip flops of control sets two, three, four, six, and eight respectively. Cluster region 200 includes only two flip flops belonging to control set five, three flip flops belonging to control set seven, and one flip flop belonging to control set nine. Thus, the system generates cluster F including the two flip flops of control set five, cluster H including the three flip flops belonging to control set seven, and control set J including the one flip flop belonging to control set nine.

FIG. 2 illustrates that clustering is performed locally within each respective cluster region on the programmable IC. In this regard, the components available for inclusion within a given cluster are limited not only by type and control set, but also are limited to only those located within the same cluster region after global placement. In general, the system generates fewer clusters as the size of the cluster regions increases. The number of clusters decreases since the pool of available components for cluster creation grows, resulting in less fragmentation in terms of clusters with fewer than four flip flops.

Figure 3:
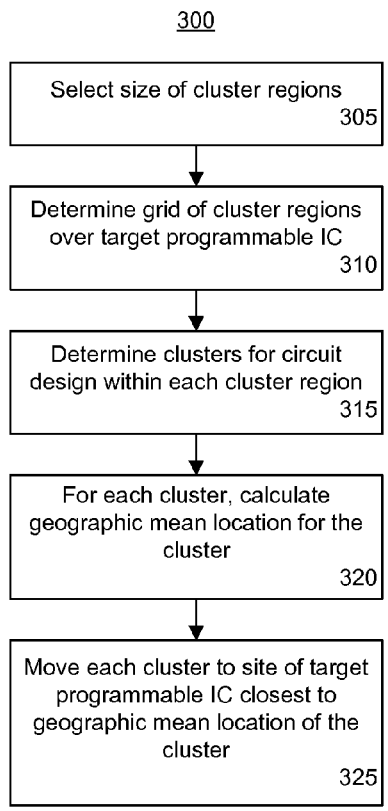
FIG. 3 is a flow chart illustrating a method of clustering a circuit design in accordance with another embodiment of the present invention.

FIG. 3 is a flow chart illustrating a method 300 of clustering a circuit design in accordance with another embodiment of the present invention. FIG. 3 presents a more detailed illustration of the clustering process described with reference to FIG. 2. Method 300 can be performed by the system described with reference to FIGS. 1 and 2.

Method 300 can begin in step 305, where the system can select a size of the cluster regions. As noted, the size of the cluster regions can be specified in terms of a length and width or a radius. For example, a size of 2×2 can be selected in reference to columns of slices. Accordingly, each cluster region will be two slices wide and two slices in height. In step 310, the system can determine a grid of cluster regions over the target programmable IC. The grid of cluster regions of the size selected in step 305 can be determined over the entirety of the target programmable IC.

In step 315, the system can determine clusters for the circuit design within each of the cluster regions. Components of the same control set are grouped into clusters as described with reference to FIG. 2. Only those components of the same type, within a same cluster region, that belong to the same control set can be included within a same cluster. In step 320, a location referred to as the geographic mean location can be calculated for each cluster within each cluster region. In one embodiment, the geographic mean location for a selected cluster can be determined by taking the mean value of the x-coordinates of each component within the selected cluster and the mean value of the y-coordinates of each component within the selected cluster.

In illustration, consider a selected cluster within a cluster region having four flip flops with coordinates of (1, 5), (2, 5), (5, 1), and (4, 4). The x-coordinate of the geographic mean location of the selected cluster can be calculated as (1+2+5+4)/4=3. The y-coordinate of the geographic mean location of the selected cluster can be calculated as (5+5+1+4)/4=3.75. Thus, the selected cluster is assigned a location of (3, 3.75). The geographic mean location of the selected cluster is located within the same cluster region as each of the flip flops of the cluster. The process can be performed for each cluster.

In step 325, each cluster can be moved to a site of the programmable IC that is closest to the geographic mean location of the cluster. Thus, the cluster is assigned the coordinate of the site of the target programmable IC that is closest to the geographic mean location of that cluster. In this example, where flip flops are the components (type of components) that are clustered, each cluster can be relocated to the slice nearest the geographic mean location of that cluster.

Figure 4:
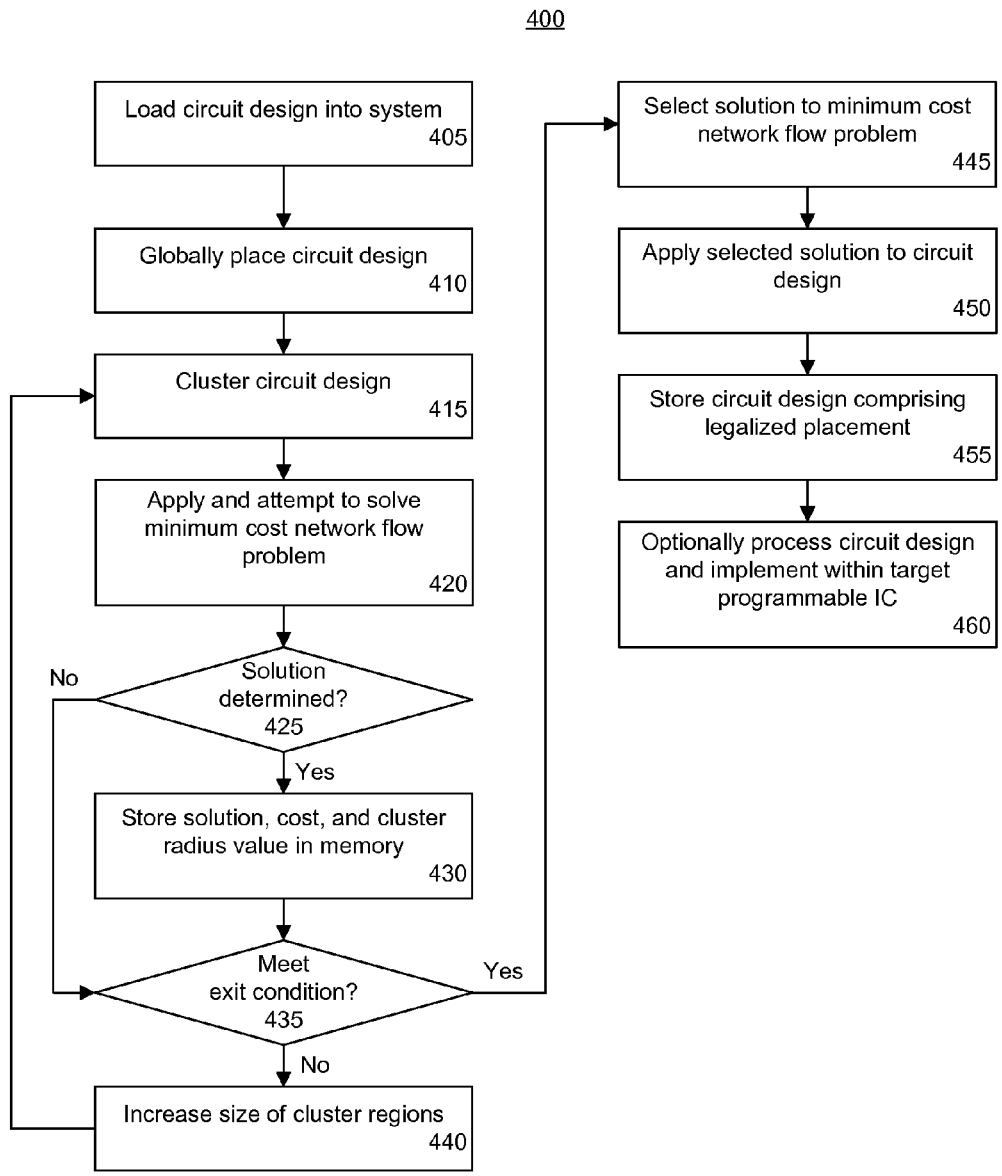
FIG. 4 is a flow chart illustrating a method of placing a circuit design in accordance with another embodiment of the present invention.

FIG. 4 is a flow chart illustrating a method 400 of placing a circuit design in accordance with another embodiment of the present invention. Method 400 can be performed by a system as described with reference to FIGS. 1-3. Accordingly, in step 405, the system can load a circuit design into memory for processing, e.g., placement. The circuit design, at this point, is unplaced.

In step 410, the system can globally place the circuit design. Components of the circuit design are assigned coordinates using the coordinate system overlaid atop the target programmable IC. As noted and illustrated with respect to FIG. 2, the coordinates assigned to components during global placement may, but need not, correspond to the coordinates of sites on the target programmable IC. Any of a variety of global placement techniques can be used. In general, however, global placement attempts to locate components that are related to one another closer together to minimize, at least in general terms, delay and the like. Applying clustering after this stage allows the benefits of global placement to carry through and survive the clustering process.

In step 415, the system can cluster the circuit design as described with reference to FIGS. 2 and 3. Thus, each cluster includes up to a maximum number of components corresponding to the capacity of a slice and each component within the cluster belongs to the same control set. Once clusters are defined, each cluster is assigned a coordinate location corresponding to the geometric mean location of that cluster.

In step 420, the system can apply and attempt to solve a minimum cost network flow problem to legalize the global placement. A solution to the minimum cost network flow problem (hereafter "network flow problem"), specifies a legalized placement of the circuit design given the selected size of the cluster regions. The network flow problem is a graph-based approach to legalization of global placement. The network flow problem uses a graph representation of the target programmable IC where sites on the target programmable IC are considered nodes (vertices) of the graph. For example, CLBs of the target programmable IC can be selected as nodes or slices within CLBs can be selected as nodes depending upon the particular approach being used for placement and/or legalization. For purposes of illustration within this specification, slices will be considered nodes of the graph.

Each node will have one or more neighboring nodes, e.g., one above, one below, one to the right, and/or one to the left. Within the graph, edges (lines) exist among neighboring nodes. In one embodiment, the graph can be cyclic. In another embodiment, the graph can be directed in that if nodes one and two are neighbors, there exists an edge between node one and node two and also an edge between node two and node one.

Each edge can be associated with a cost that reflects delay penalty of moving clusters along the edge. More particularly, each edge can have a flow that indicates the number of clusters that must traverse that edge to solve the network flow problem. Each cluster can be associated with a time delay that is caused or incurred within the circuit design by moving the cluster from a source node after clustering, to the destination node. The cost of an edge within the graph can be calculated by multiplying the flow of the edge by the sum of the time delays incurred as a consequence of moving each selected cluster down that edge. The cost of a given solution can be calculated as the sum of the costs of edges over the entire graph.

During the clustering process, recall that each cluster is relocated to a particular node nearest to the geographic mean location of the cluster. In solving the network flow problem, the system can determine the capacity of each node and the utilization of each node as measured in clusters. Presuming that a slice is a node, each node has a capacity of one cluster. The utilization of each node refers to the number of clusters assigned to that node. Clusters are moved from nodes where utilization is greater than capacity to nodes where capacity is greater than utilization. Clusters can be "pushed" through the graph of the network. When more than one cluster resides at a node, the cluster(s) to be pushed to another node can be ordered according to cost. The cluster(s) that result in the lowest cost on the edge linking the source node and the destination node can be selected for relocation.

In illustration, consider the case in which the network flow problem to be solved requires that two clusters are to be moved from slice 0 to slice 1, that three clusters are to be moved from slice 1 to slice 2, and that one cluster is to be moved from slice 2 to slice 3. Accordingly, the system can determine the clusters within slice 0 and determine the expense of moving each cluster from slice 0 to slice 1, e.g., the destination node. When one cluster is more critical than the other clusters at a source node, the system determines that moving the more critical cluster is more expensive than moving the less critical clusters. The system moves the clusters with the cheapest or lowest cost from slice 0 to slice 1. The total number of clusters within slice 1 is now two greater than the number of clusters originally within slice 1.

The system then repeats the process and begins moving clusters from slice 1 to slice 2. Since three clusters were to be moved from slice 1 to slice 2 prior to the move operation described with respect to slice 0 and slice 1 that moved two clusters into slice 1, slice 1 now has five clusters that must be moved to slice 2. The five clusters to be moved from slice 1 to slice 2 are those clusters of slice 2 with the cheapest cost. The process continues moving clusters from slice 2 to slice 3 and so on until the flow is completed. As the system continues the process, the same clusters may or may not propagate from one node to the next. The clusters moved are those with the lowest cost at each respective node, which is determined as clusters "flow" through the graph as demonstrated with respect to slice 1 in this example.

In step 425, the system can determine whether a solution to the network flow problem is determined. If so, method 400 can continue to step 430. If not, method 400 can continue directly to step 435. The solution to the network flow problem specifies the flow of clusters through the graph, and thus, the target programmable IC. In this regard, the solution to the network flow problem also specifies a legalized placement of the circuit design should the different flows be applied to the clustered circuit design.

Proceeding with step 430, the system can store the solution to the network flow problem and the cost associated with that solution. The size of the cluster region used in solving the network flow problem also can be stored in association with the solution and the cost.

In step 435, the system can determine whether an exit condition is met. The exit condition can depend upon one or more or any of a variety of parameters such as the number of clustering iterations that have been performed, the number of legalized placements that have been determined (successful solutions to the network flow problem for different sizes of cluster regions), or the like. In illustration, when clustering has been performed a predetermined number of times or when a predetermined number of legalized placements have been determined, method 400 can continue to step 445.

In another embodiment, the exit condition can be that the system has repeated clustering and attempted solutions of the network flow problem over a predetermined range or set of sizes of cluster regions. For example, presuming the cluster regions to be square shaped for simplicity, an exit condition can be met when the system has performed clustering and attempted to determine a network flow solution for the set of cluster regions with sides of length one to "N," where N is a predetermined integer greater than one and sides of the cluster regions are specified in terms of slices.

In step 440, the system can increase the size of the cluster regions used during clustering. For example, a length, a width, or both can be increased by a predetermined amount, whether by one or a value greater than one. The increased size of cluster regions can be used in the next iteration of clustering, e.g., in step 305 of FIG. 3. In general, fewer clusters will result in lower network flow to be legalized since fewer clusters are available to be pushed through the network. Recall that larger sized cluster regions generally result in fewer clusters. Increasing the size of cluster regions, however, can result in increased perturbation of the global placement during clustering, but decreased perturbation of the clustered circuit design during legalization when solving the network flow problem. Conversely, decreasing the size of the cluster regions can reduce perturbation of the global placement during clustering, but increase perturbation of the clustered circuit design during legalization. Because it is not known a priori which size of cluster region is most desirable, the system can iterate through a plurality of sizes of cluster regions. After step 440, method 400 can loop back to step 415 to continue processing.

When an exit condition has been met, method 400 continues from step 435 to step 445. In step 445, the system can select a solution to the network flow problem. In one embodiment, the system can select the solution that has the lowest cost of all of the solutions determined. Since each solution specifies a legalized placement, the system effectively is selecting a legalized placement according to cost. In step 450, the system can apply the selected solution to the circuit design. The network flows specified by the selected solution can be applied to the clusters to generate a legally placed circuit design, e.g., a legalized placement of the circuit design. As noted, components can be relocated, e.g., assigned coordinates, per the solution of the network flow problem selected in step 445. In step 455, the resulting legalized placement, or circuit design comprising the legalized placement, can be stored within memory. In step 460, the circuit design optionally can be further processed and implemented as hardware within the target programmable IC.

The embodiments disclosed within this specification provide methods, systems, and apparatus for placing a circuit design. More particularly, a legalized placement of the circuit design can be determined by application of a clustering technique after global placement is performed. Application of clustering post global placement accommodates packing rules of the components being placed while also taking advantage of placement decisions made during the global placement process.

The speed at which the system can determine solutions for the minimum cost network flow problem allows the techniques described within this specification to be iterated a plurality of times to arrive at a desirable legalized placement of the circuit design. Further, the quality of result obtained is not dependent upon the order in which components are selected for legalization due to the clustering performed. Thus, the embodiments disclosed herein can obtain legalized placement solutions more rapidly and with better quality of result than, for example, conventional techniques that relocate illegal components one by one. Such techniques first select an illegally placed component, conduct a spiral type search that extends outward from the current location of the component in search of a legal location, and then repeat for further illegally placed components. The quality of result of such techniques depends heavily upon the order in which components are selected for legalization.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. Within a system comprising a processor and a memory, a method comprising:
   performing a global placement of a circuit design for a target programmable integrated circuit (IC);
   clustering the circuit design using a selected size of cluster regions according to control sets identified within the circuit design;
   wherein each control set specifies a group of at least one component having same control signals;
   determining, by the processor, a legalized placement of the clustered circuit design by solving a minimum cost network flow problem for the selected size of cluster regions and the target programmable IC;
   assigning components to sites of the target programmable IC according to the legalized placement; and
   storing the circuit design specifying the legalized placement within the memory.

2. The method of claim 1, further comprising:
   iteratively clustering and determining a legalized placement over a plurality of different sizes of cluster regions generating a plurality of legalized placements;
   determining a cost for each legalized placement; and
   storing each legalized placement in the memory in association with the cost of the legalized placement and the size of the cluster regions used in determining the legalized placement.

3. The method of claim 2, further comprising:
   selecting one of the plurality of legalized placements according to cost of each of the plurality of legalized placements.

4. The method of claim 2, further comprising:
   increasing the size of the cluster regions used to perform clustering after each iteration of the clustering and the determining a legalized placement.

5. The method of claim 1, wherein the clustering comprises:
   assigning only components belonging to a same control set to a same cluster.

6. The method of claim 1, wherein the clustering comprises:
   limiting a number of components to be included within each cluster to a capacity of a hardware resource capable of receiving a cluster.

7. A system, comprising:
   a memory storing program code; and
   a processor coupled to the memory and executing the program code, wherein the processor is configured to perform steps comprising:
   performing a global placement of a circuit design for a target programmable integrated circuit (IC);
   clustering the circuit design using a selected size of cluster regions according to control sets identified within the circuit design;
   wherein each control set specifies a group of at least one component having same control signals;
   determining a legalized placement of the clustered circuit design by solving a minimum cost network flow problem for the selected size of cluster regions and the target programmable IC;
   assigning components to sites of the target programmable IC according to the legalized placement; and
   storing the circuit design specifying the legalized placement within the memory.

8. The system of claim 7, wherein the processor is further configured to perform steps comprising:
   iteratively clustering and determining a legalized placement over a plurality of different sizes of cluster regions generating a plurality of legalized placements;
   determining a cost for each legalized placement; and
   storing each legalized placement in the memory in association with the cost of the legalized placement and the size of the cluster regions used in determining the legalized placement.

9. The system of claim 8, wherein the processor is further configured to perform a step comprising:
   selecting one of the plurality of legalized placements according to cost of each of the plurality of legalized placements.

10. The system of claim 8, wherein the processor is further configured to perform a step comprising:
    increasing the size of the cluster regions used to perform clustering after each iteration of clustering and determining a legalized placement.

11. The system of claim 7, wherein the clustering comprises:
    assigning only components belonging to a same control set to a same cluster.

12. The system of claim 7, wherein the clustering comprises:
    limiting a number of components to be included within each cluster to a capacity of a hardware resource capable of receiving a cluster.

13. A device, comprising:
    a data storage medium usable by a system comprising a processor and a memory, wherein the data storage medium stores program code that, when executed by the system, configures the system to execute operations comprising:
    performing a global placement of a circuit design for a target programmable integrated circuit (IC);

clustering the circuit design using a selected size of cluster regions according to control sets identified within the circuit design;

wherein each control set specifies a group of at least one component having same control signals;

determining a legalized placement of the clustered circuit design by solving a minimum cost network flow problem for the selected size of cluster regions and the target programmable IC;

assigning components to sites of the target programmable IC according to the legalized placement; and storing the circuit design specifying the legalized placement within the memory.

14. The device of claim 13, wherein the operations further comprise:

iteratively clustering and determining a legalized placement over a plurality of different sizes of cluster regions generating a plurality of legalized placements;

determining a cost for each legalized placement; and storing each legalized placement in the memory in association with the cost of the legalized placement and the size of the cluster regions used in determining the legalized placement.

15. The device of claim 14, wherein the operations further comprise:

selecting one of the plurality of legalized placements according to a cost of each of the plurality of legalized placements.

16. The device of claim 14, wherein the operations further comprise:

increasing the size of the cluster regions used to perform clustering after each iteration of clustering and determining a legalized placement.

17. The device of claim 13, wherein the clustering comprises:

assigning only components belonging to a same control set to a same cluster.

* * * * *